US012580591B1

(12) United States Patent
Azizoglu

(10) Patent No.: US 12,580,591 B1
(45) Date of Patent: Mar. 17, 2026

(54) SYSTEMS AND METHODS OF TILED CONCATENATION OF FORWARD ERROR CORRECTION CODES

(71) Applicant: Cisco Technology, Inc., San Jose, CA (US)

(72) Inventor: Murat Azizoglu, Concord, MA (US)

(73) Assignee: Cisco Technology, Inc., San Jose, CA (US)

( * ) Notice: Subject to any disclaimer, the term of this patent is extended or adjusted under 35 U.S.C. 154(b) by 28 days.

(21) Appl. No.: 18/606,310

(22) Filed: Mar. 15, 2024

Related U.S. Application Data

(60) Provisional application No. 63/452,796, filed on Mar. 17, 2023.

(51) Int. Cl.
H03M 13/11 (2006.01)
H04L 1/00 (2006.01)

(52) U.S. Cl.
CPC ....... H03M 13/1102 (2013.01); H04L 1/0057 (2013.01)

(58) Field of Classification Search
CPC ............. H03M 13/253; H03M 13/255; H03M 13/2703; H03M 13/1102; H04L 1/0041; H04L 1/0057; H04L 1/0071
See application file for complete search history.

(56) References Cited

U.S. PATENT DOCUMENTS

| | | | | | |
|---|---|---|---|---|---|
| 7,116,710 | B1* | 10/2006 | Jin | ..................... | H03M 13/1102 |
| | | | | | 375/240 |
| 2005/0135298 | A1* | 6/2005 | Wei | ................... | H03M 13/2903 |
| | | | | | 370/328 |
| 2009/0150752 | A1* | 6/2009 | Nebat | ................... | H03M 13/09 |
| | | | | | 714/776 |
| 2019/0363738 | A1* | 11/2019 | Strobel | ............. | H03M 13/2906 |

* cited by examiner

*Primary Examiner* — Shelly A Chase
(74) *Attorney, Agent, or Firm* — Patterson + Sheridan, LLP

(57) ABSTRACT

In part, in one aspect, the disclosure relates to a tiled concatenation system. The system may include an encoder system comprising one or more outer encoders, wherein at least one outer encoder is configured to generate n bits from k bits; a framer comprising an input, wherein the input receives T groups of n bits, wherein the framer is configured to rearrange the T groups of n bits to generate a set of T tiles, wherein each tile comprises L*C bits to generate a frame comprising L rows of K bits, the framer configured to rearrange a fraction of C bits per tile per row of each frame such that the fraction of high quality and low quality bits at the encoder output will be balanced among the tiles using an inner encoder; and the inner encoder comprising the fraction of C bits.

20 Claims, 6 Drawing Sheets

SYSTEMS AND METHODS OF TILED CONCATENATION OF FORWARD ERROR CORRECTION CODES

CROSS REFERENCE TO RELATED APPLICATIONS

This application claims priority to and the benefit of U.S. Provisional Patent Application No. 63/452,796 filed on Mar. 17, 2023, the disclosure of which is herein incorporated by reference in its entirety.

FIELD

This disclosure relates generally to the field of error correcting codes.

BACKGROUND

Contemporary communications systems make extensive use of various error correcting codes for various purposes.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

OVERVIEW

Figure 1:
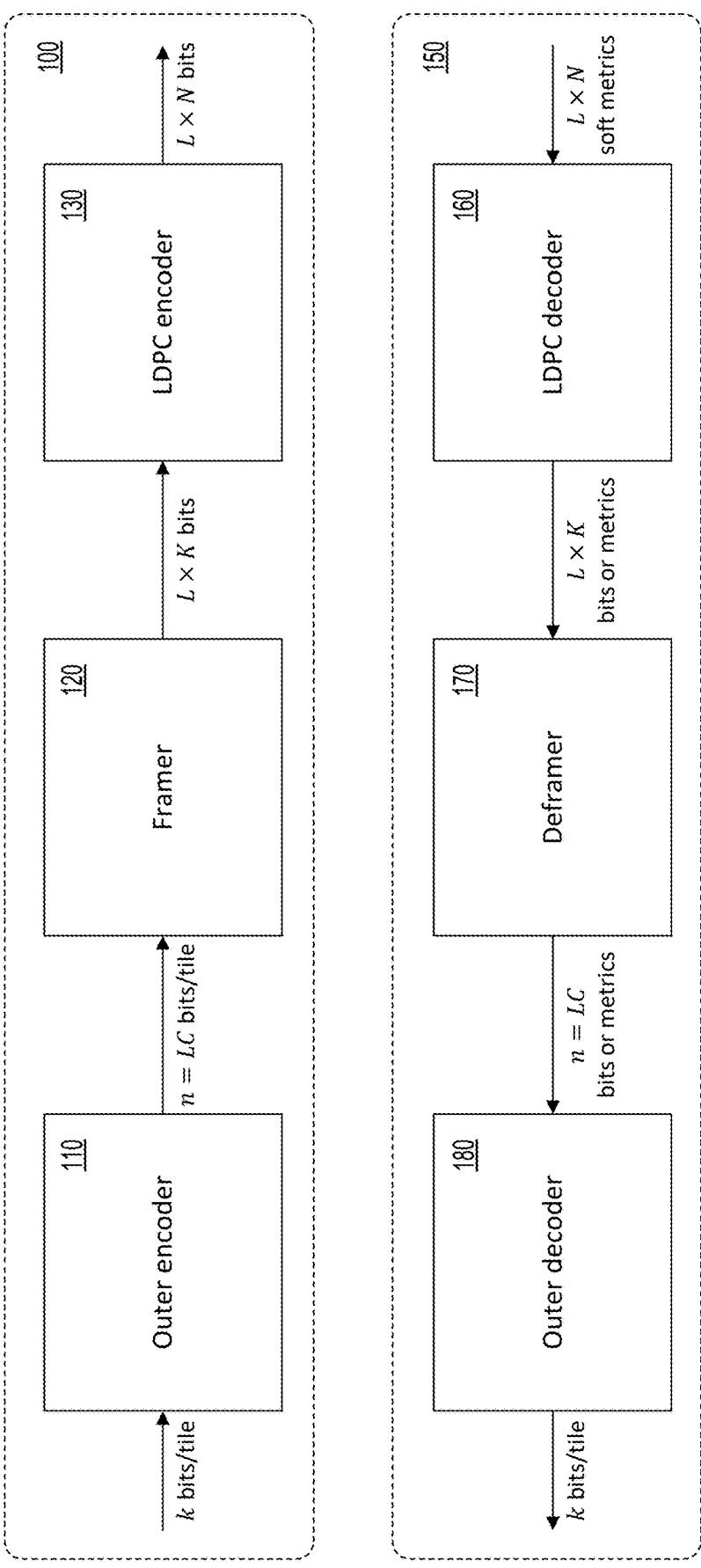
FIG. 1 is a high-level block diagram of a low-density parity check (LDPC) encoder with tiled and precoded inputs and an associated decoder according to an exemplary embodiment of the disclosure.

In part, in one aspect, the disclosure relates to a tiled concatenation system or encoding/decoding system. The system may include an encoder system comprising one or more outer encoders, wherein at least one outer encoder is configured to generate n bits from k bits; a framer comprising an input, wherein the input receives T groups of n bits, wherein the framer is configured to rearrange the T groups of n bits to generate a set of T tiles, wherein each tile comprises L*C bits to generate a frame comprising L rows of K bits, the framer configured to rearrange a fraction of C bits per tile per row of each frame such that the fraction of high quality and low quality bits at the encoder output will be balanced among the tiles using an inner encoder; and the inner encoder comprising the fraction of C bits.

In part, in another aspect, the disclosure relates to a method that includes generating n bits from k bits using an outer encoder; configuring a framer having an input to rearrange T groups of n bits to generate a set of T tiles, wherein each tile comprises L*C bits to generate a frame comprising L rows of K bits; and receiving T groups of n bits at the input of the framer; and rearranging a fraction of C bits per tile per row of each frame such that the fraction of high quality and low quality bits at the encoder output will be balanced among the tiles using an inner encoder.

EXAMPLE EMBODIMENTS

Low-density parity check (LDPC) codes generally exhibit small but non-negligible numbers of decoding errors even at low bit error rates. A large uncertainty in the decoding time is undesirable in high performance systems. In part, the disclosure improves the operation of various LDPC encoding and decoding systems and methods to address these errors and other encoding/decoding related challenges.

In part, the disclosure relates to a systems, devices, and methods configured to precode an input to a low-density parity check (LDPC) encoder. In one aspect, the method includes an arbitrary outer encoder, a framer which produces tiles (matrices) from codewords from the outer encoder, and an inner LDPC encoder. In some aspects, the method may lower an error floor of a forward error correction (FEC) block to $10^{-15}$ errors per bit. In some embodiments, the tiling of codewords from an outer encoder may reduce a variance of a number of iterations in the LDPC decoder. In various embodiments, the disclosure relates to systems, codes, codewords, devices, and methods configured to reducing the error floors commonly encountered with such codes and support various communication applications that may specify maintaining a low bit error rates (BER), such as a BER about or less than about $10^{-15}$. In many embodiments, the disclosure relates to optical communication systems suitable for encoding, transmitting, receiving, and decoding optical signals.

In some embodiments, the LDPC code may be regular or irregular. In various embodiments, when the LDPC code is irregular, a framer may also include an interleaver that rotates, permutes, randomizes, or otherwise rearranges bits in a tile or across tiles such that high-degree LDPC code word bits are uniformly distributed among the tiles. In some embodiments, a rearrangement of bits in this manner is more likely to produce a lower frequency of errors across codewords from the outer decoder.

In part, in various embodiments, the disclosure relates to an encoding system and a decoding system and related methods based on precoded LDPC codes. In some embodiments, the LDPC codes used are iterative and exhibit a distribution in a number of iterations in a decoding process. In some embodiments of the encoding system, an input to an inner LDPC encoder may include or be correlated with a fragment of each codeword from a set of codewords produced by an arbitrary outer encoder. The remaining fragments or data correlated therewith in the set may form additional inputs to the LDPC encoder. As a result, in various embodiments, a subset of fragments from the set may be used to generate inputs for an inner LDPC such that multiple LDPC codewords may be multiplexed and/or transmitted. In many embodiments, a frame structure or other data structure may be used into which multiple LDPC code words are multiplexed, and from which rectangular tiles are derived. In some embodiments, the frame includes a set of tiles and a section of LDPC parity rows. The data payload is typical part of the set of tiles in a multiplexed and/or encoded format.

Multiplexing many LDPC codewords in a block, frame, or other data structure brings the number of decoding iterations per codeword in the block, frame, or other data structure close to a statistical average. Building an input to a single LDPC codeword from fragments of codewords produced by an outer encoder distributes any decoding errors in the LDPC code among the codewords from the outer code. Finally, in some embodiments, an encoding system disclosed herein includes an interleaver that rearranges bits in an input to an irregular LDPC code such that each codeword produced by the outer encoder is equally or almost equally represented in each degree of the LDPC code. That is to say, codewords from the outer encoder equally or almost equally occupy the available high-degree, high-reliability bit positions in the LDPC code. In this context, high degree bits correspond to the columns of the parity check matrix of the code with a relatively large number of 1's in comparison with other columns. This implies these high degree bits participate in a greater number of parity check equations, thus making them more reliable and less error prone relative to the lower degree bits.

Refer now to the example embodiment of FIG. 1. FIG. 1 is a high-level block diagram of a precoded LDPC encoding system 100 and decoding system 150. In some embodiments, the encoding system 100 provides outputs that are inputs for the decoding system 150. The encoding system may include an outer encoder 110, a framer 120, and an LDPC encoder 130. The outer encoder may be based on an arbitrary code in most embodiments. In most embodiments, an outer encoder accepts k input bits to produce a single 'tile' of n bits. In some embodiments, a tile is a two-dimensional arrangement of bits where L represents one dimension and C represents the other dimension. Various metrics and other parameters may be passed between the various components shown in FIG. 1. In various embodiments, the encoder, framer, decoder, and deframer may all be implemented in the same chip or individual chips or combinations thereof.

In many embodiments, the framer 120 accepts T tiles with n=LC bits per tile and produces a block of L×K bits. Finally, an LDPC encoder 130, also called the inner encoder, produces, from the block of L×K bits, L codewords of length N. Similarly, an associated decoding system 150 decodes the L×N output of the encoding system 100 corrupted by noise and other transmission impairments such as intersymbol interference, nonlinear signal distortion, etc. In most embodiments, the decoding system comprises an LDPC decoder 160 (the inner decoder), a deframer 170, and an outer decoder 180. In most embodiments, an LDPC decoder 160 receives soft metrics, typically quantized or saturated values of log-likelihood ratios (LLRs) of each encoded bit. In various embodiments, other soft metrics may include goodness of fit tests, correlation metrics, convergence metrics and other suitable metrics or parameters or control variables. When soft metrics are used as the input to the decoder, the performance is generally improved relative to a decoder that uses only the binary values of the received bits. By providing a measure of reliability of the value of a bit, the use of soft metrics may be used to reduce the bit error rates for the same transmit power and other system parameters.

Figure 2:
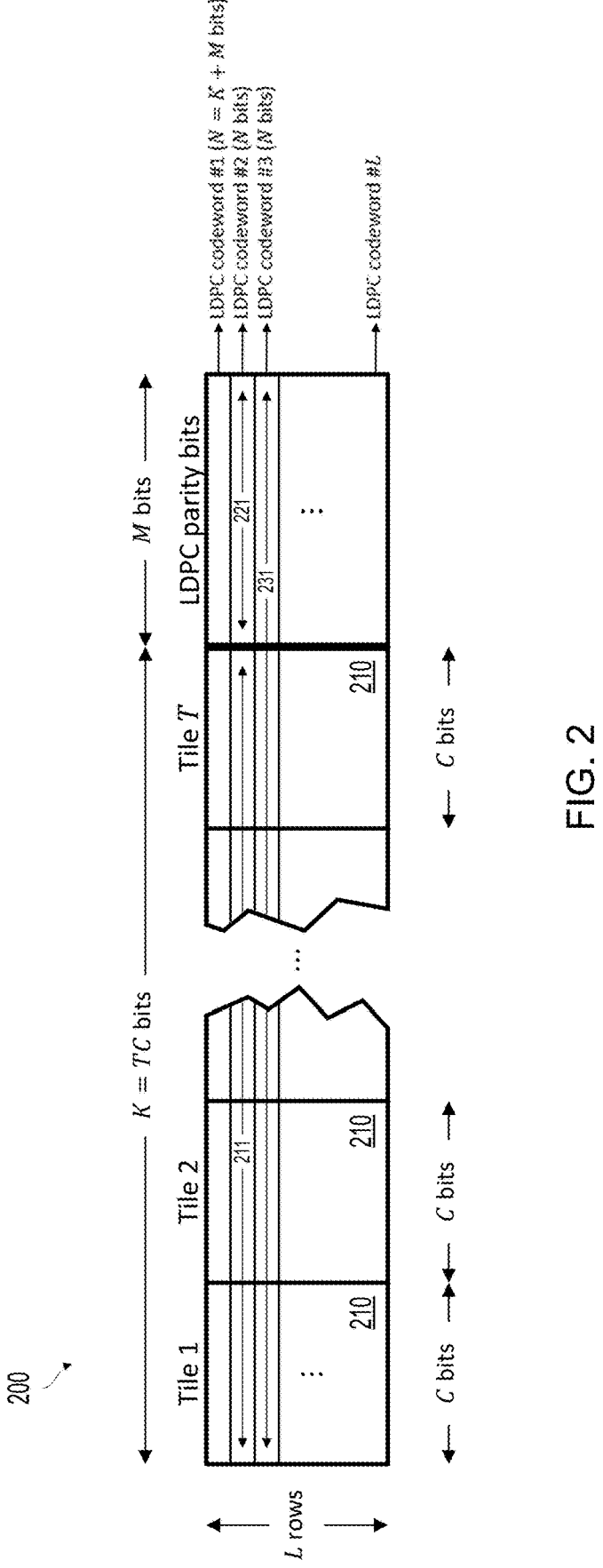
FIG. 2 is a diagram of a frame structure wherein tiled and precoded inputs form the basis of LDPC-encoded codewords according to an exemplary embodiment of the disclosure.

Refer now to the example embodiment of FIG. 2. FIG. 2 is a diagram of a frame structure 200 produced or processed by an encoding system 100 or decoding system 150 as disclosed herein. In most embodiments, each codeword from an outer encoder is arranged into a tile 210 having L rows and C columns. In some embodiments, T tiles are joined, merged, or linked to produce L rows 211 of K=TC bits. Each row 211 of K bits is an input to the LDPC encoder. The LDPC encoder attaches to or operates upon each row 211 a sequence 221 of M parity bits. Each pair of an LDPC input and an adjacent sequence 221 of LDPC parity bits may include or define an LDPC codeword 231 of length N=K+M bits. In some embodiments, L ranges from about 1 to about 1000, wherein C ranges from about 1 to about 1000, and wherein T ranges from about 1 to about 1000. The tile 210 is a two-dimensional tile in various embodiments.

In most embodiments, an LDPC decoder 160 processes LX N soft metrics for each encoded bit in the frame structure 200. The LDPC decoder processes the LDPC codewords row by row, producing K bits or LLR metrics per row of the frame in addition to a 'convergence indicator' (CI) for each row of the frame. In some embodiments, once an entire frame of L rows has been decoded, one of two outcomes may occur: (i) all rows converge, i.e. the convergence indicator is set to one for each row, producing a valid LDPC codeword for each row, or (ii) one or more of the rows of the frame has not converged. If all rows converge, soft metrics are replaced with decoded bits in the frame. The deframer 170 distributes individual tiles 210 to the outer decoder 180, and the outer decoder replicates the k information bits from n bits in the codeword. If all rows in the frame had converged, the outer decoder is bypassed, potentially saving power and computation time. Conversely, in some embodiments, if at least one of the rows has not converged, then the outer decoder decodes each of the T tiles, producing k bits per outer code word/tile.

Figure 3:
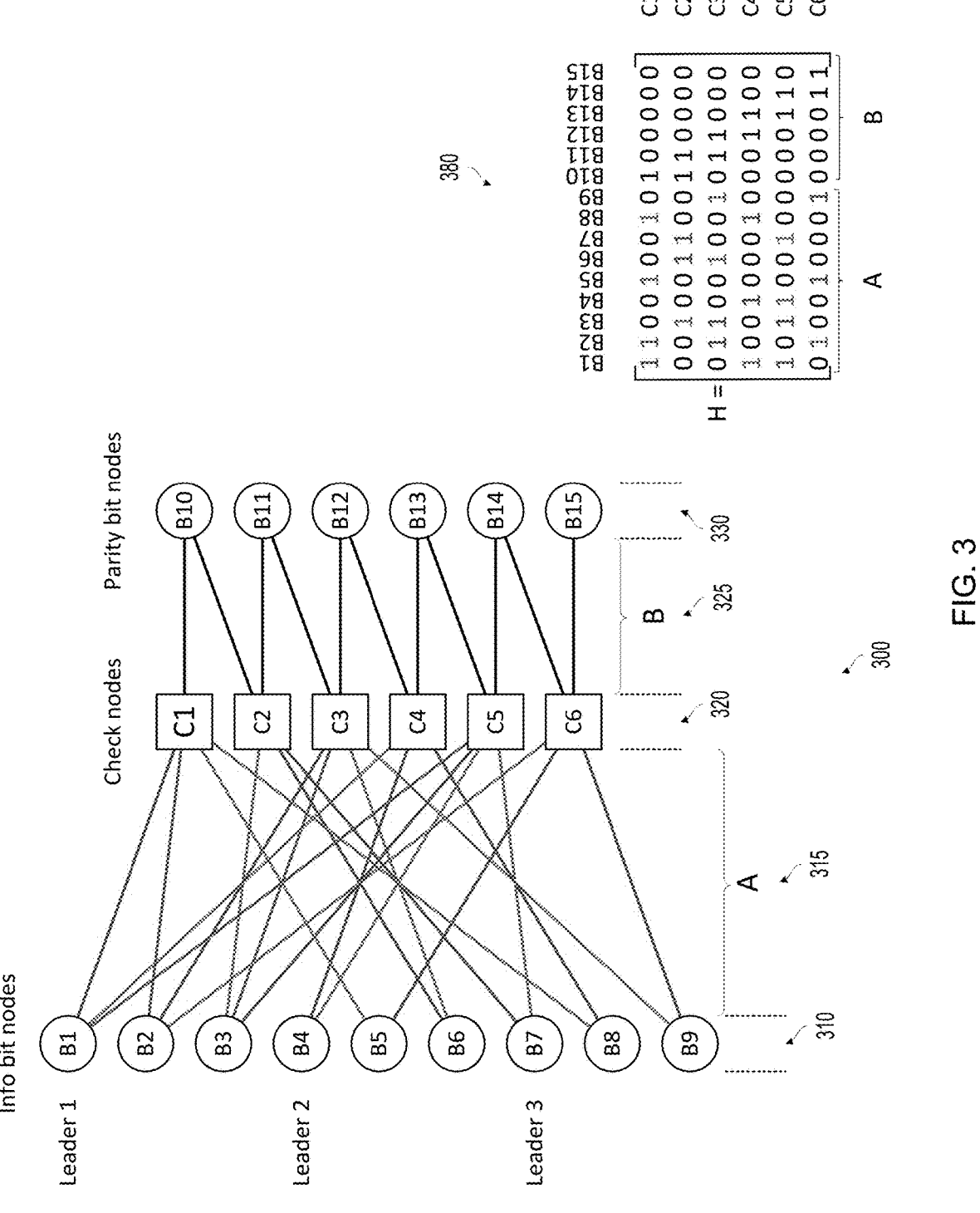
FIG. 3 is a plot of a Tanner graph of an irregular LDPC code according to an exemplary embodiment of the disclosure.

Refer now to the example embodiment of FIG. 3. FIG. 3 is an example Tanner graph 300 of an irregular LDPC code and its associated parity check matrix 380. Parity bits 330 and the groups of information bits 310 that they correspond to form the inputs to check nodes 320. The parity check matrix 380 represents the adjacency matrix of the Tanner graph, where edges 315, 325 are represented as nonzero elements in the matrix. The LDPC code represented in the Tanner graph 300 and parity check matrix 380 is irregular as not all information bit nodes have the same degree. This corresponds to different columns of the parity check matrix having different Hamming weights. The check nodes of the Tanner graph may or may not have identical degrees; the check node degrees correspond to the row Hamming weights in the parity check matrix.

Figure 4B:
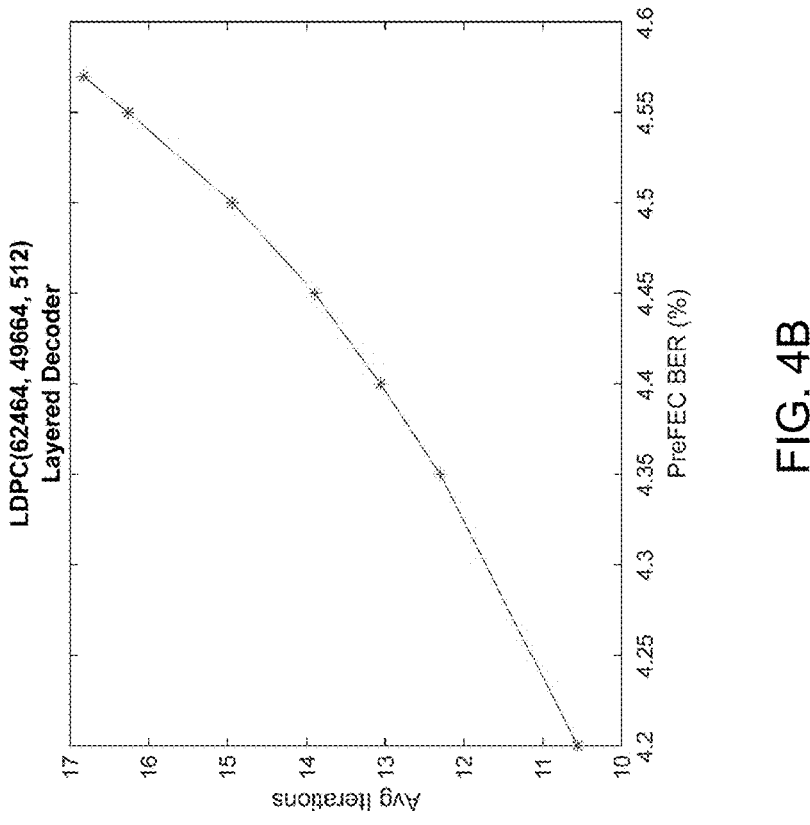
FIG. 4B is a plot of an average number of iterations of an LDPC decoder versus bit error rate according to an exemplary embodiment of the disclosure.
Figure 4A:
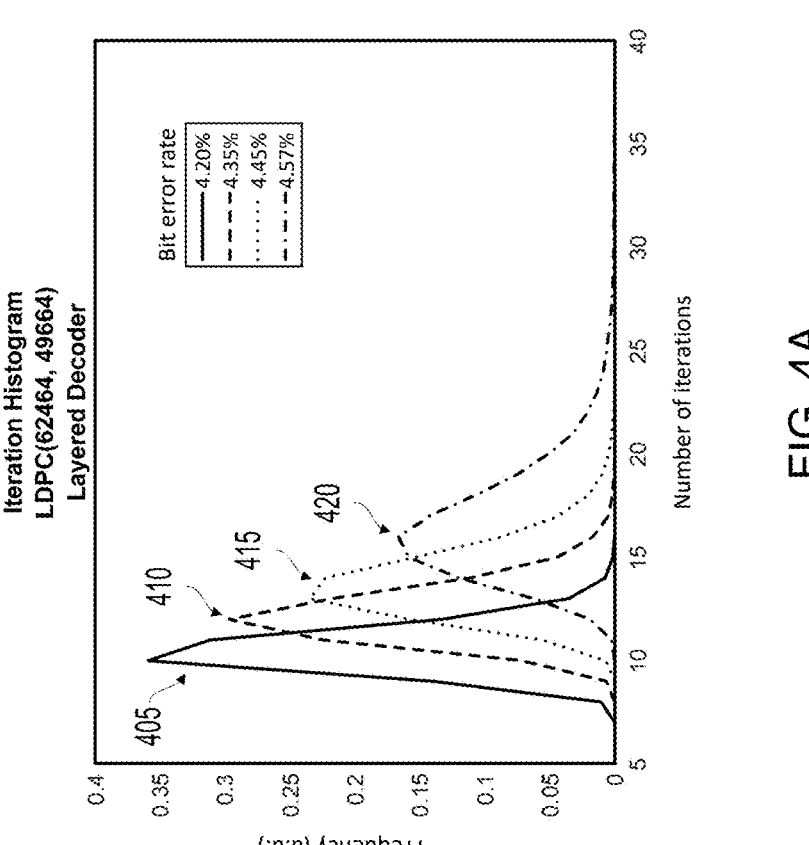
FIG. 4A is a histogram of the number of iterations of an LDPC decoder at different bit error rates according to an exemplary embodiment of the disclosure.

Refer now to the example embodiment of FIG. 4A. FIG. 4A is a histogram of a number of iterations of an LDPC decoder at four different channel bit error rates: 4.20% 405, 4.35% 410, 4.45% 415, and 4.57% 420. As the bit error rate increases, the distribution of the number of iterations required to complete an LDPC decoding widens and acquires a heavy right tail, leading to an increase in uncertainty and in the number of outliers in the time required to complete a decoding of a single LDPC codeword. In many embodiments, decoding multiple LDPC codewords at once in a frame structure 200 reduces the variance of total processing time (or number of iterations per row) compared to decoding of a single LDPC codeword.

Refer now to the example embodiment of FIG. 4B. FIG. 4B is a plot of a number of iterations of an irregular LDPC encoder versus channel bit error rate. It is observed that the average number of required iterations increases rapidly with the amount of noise in the channel in various configurations.

Figure 5B:
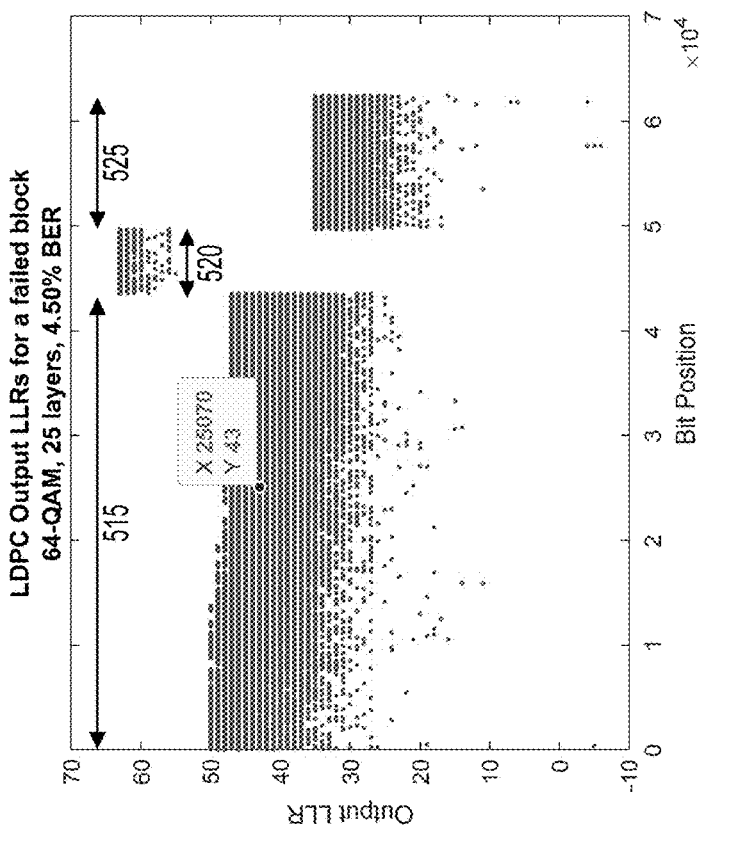
FIG. 5B is a plot of an output log-likelihood ratio as produced by an LDPC decoder versus bit position according to an exemplary embodiment of the disclosure.
Figure 5A:
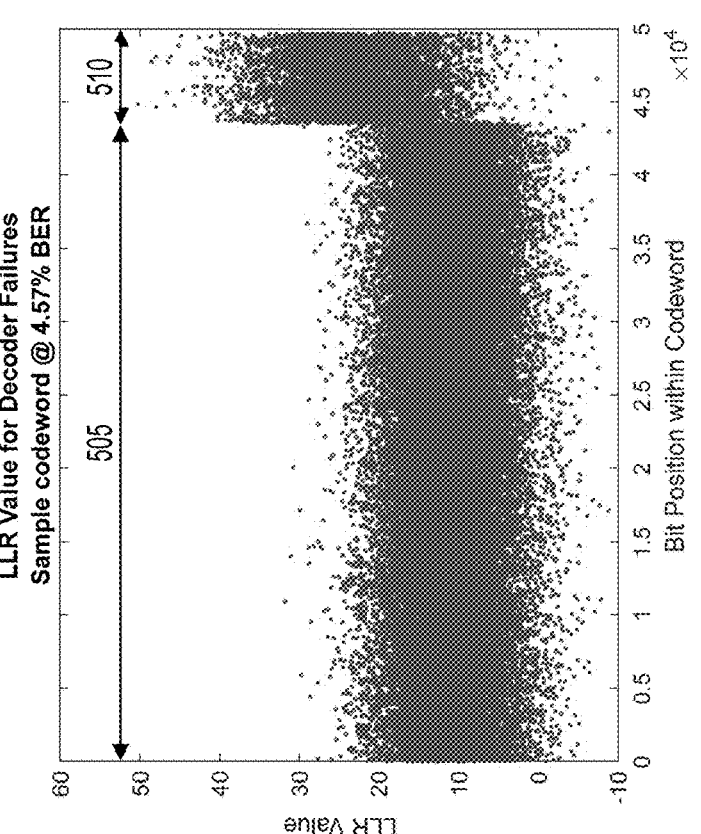
FIG. 5A is a plot of a log-likelihood ratio as produced by an LDPC decoder versus bit position for every bit in an LDPC codeword according to an exemplary embodiment of the disclosure.

Refer now to the example embodiment of FIG. 5A. FIG. 5A is a plot of a log-likelihood ratio (LLR) versus bit position for every bit in an LDPC codeword according to an exemplary embodiment of the disclosure. Degree-3 positions 505 and degree-10 positions 510 in an LDPC code are shown. Other soft metrics, such as the LLR shown, may demonstrate similar behaviors.

Refer now to the example embodiment of FIG. 5B. FIG. 5B is a plot of an output log-likelihood ratio as produced by an LDPC decoder versus bit position according to an exemplary embodiment of the disclosure. Degree-3 positions 515, degree-10 positions 520, and degree-2 positions 525 in an LDPC code are shown. It is observed that lower degree bits have lower reliability levels and vice versa.

Figure 6:
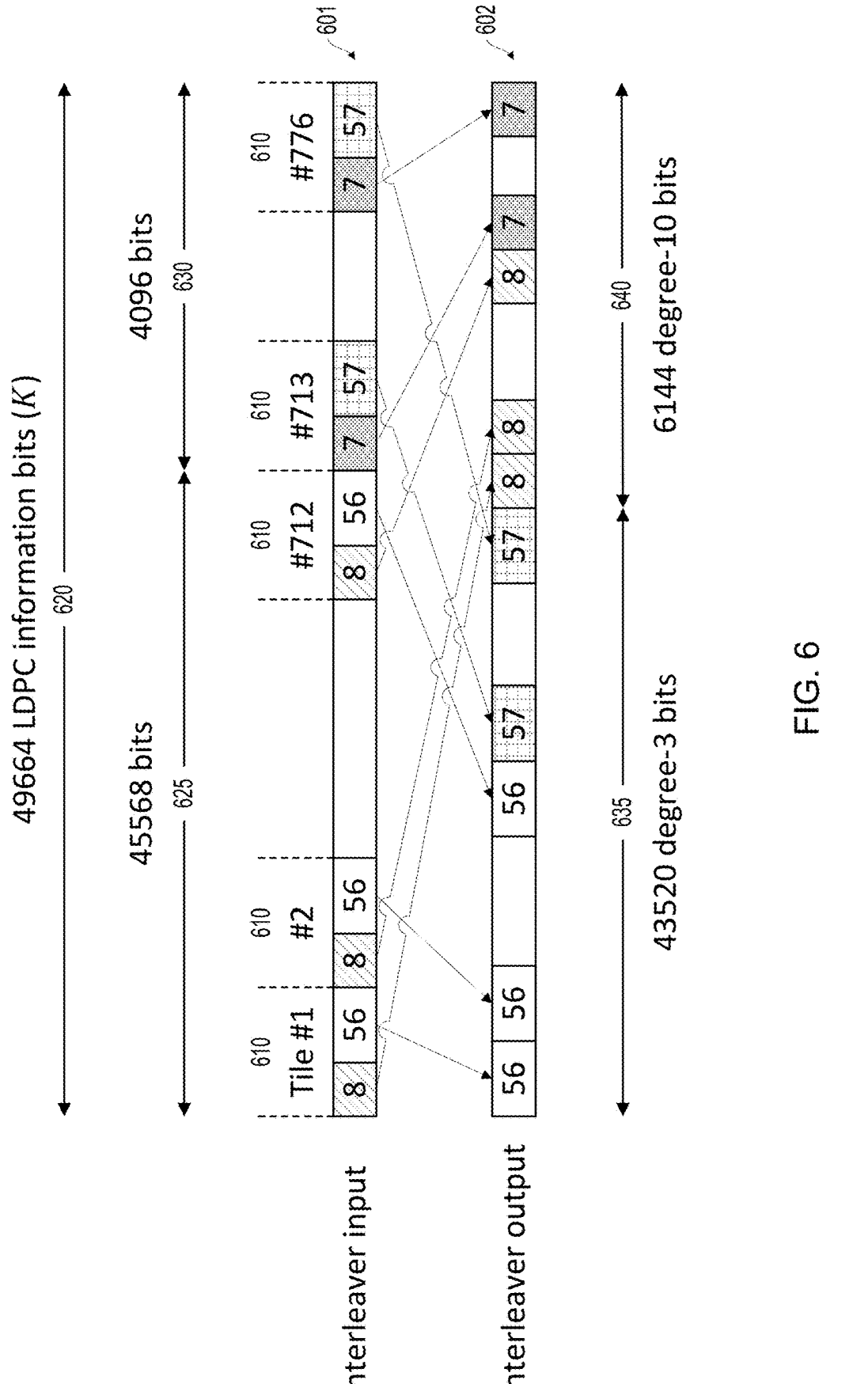
FIG. 6 is a plot of an interleaver input and an interleaver output according to an exemplary embodiment of the disclosure.

Refer now to the example embodiment of FIG. 6. FIG. 6 is an example diagram of an interleaver input 601 and output 602. An interleaver input 601 is a set of K information bits 620 provided to an LDPC encoder, corresponding to a single row 211 of a frame 200. In most embodiments, the K information bits are divided into T groups of C bits 610 per the tiled frame structure. In FIG. 6, for example, K is 49664, T is 776, and C is 64. The interleaver may be used to redistribute the K bits within each input 601 into an output 602. As a result of this redistribution, a fraction of the C bits per row per tile are represented in high-degree (low likelihood of error) inputs to the LDPC encoder, thus uniformly reducing the potential number of bits likely to be in error in each tile and so reducing the error-correcting burden of the outer decoder.

In FIG. 6, for example, an LDPC code has 43520 degree-3 bits 635 and 6144 degree-10 bits 640, wherein degree-10 bits are characterized by a lower likelihood of error compared to degree-3 bits. In the example embodiment of FIG. 6, between 7 and 8 of the 64 bits per row per tile are remapped to degree-10 LDPC input positions and the remaining 56 or 57 bits are remapped to the degree-3 positions. In the example embodiment of FIG. 6, there are not enough degree-10 input positions in the LDPC encoder to accommodate 8 bits from each tile, so only the first 712 tiles 625 remap 8 of their 64 bits (per row) to degree-10 positions, while the remaining tiles 630 remap only 7 of their 64 bits (per row) to degree-10 positions.

In one exemplary design, the following parameters may be set N=62464, K=49664, T=776, L=C=64, n=4096, k=4023 to specify details relating to the frame structure, tile structure, and other information. In various embodiments, N=K+M. K may be used to specify the input bits to the inner encoder, and M may be used to specify the parity bits added by the inner encoder. In some embodiments, the frame may be defined by L rows of K bits. The inner LDPC (N, K) code may use degrees {2, 3, 10} in the proportion 25:85:12, which allows all the information bits to be assigned degrees 3 or 10. In various embodiments, a framer, interleaver or other device may operate on T groups of n bits and rearrange those bit groups into T "tiles" of L*C bits. In various embodiments, T may be used to specify the number of tiles. As part of the exemplary design, the outer code may be an extended BCH (n,k) code capable of correcting bit errors such as T bit errors. As a result, when a single LDPC block error occurs, for C out of L*C bits in a tile are vulnerable.

In some embodiments, the framer is configured to group L innercode words together such that an amount of time needed to process a frame at the encoder and the decoder is substantially deterministic while an amount of time to process a particular row may be highly variable.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, passivation coatings/layers, optical paths, waveguides, splitters, couplers, combiners, electro-optical devices, inputs, outputs, ports, channels, components and parts of the foregoing disclosed herein can be used with any laser, laser-based communication system, waveguide, fiber, transmitter, transceiver, receiver, and other devices and systems without limitation.

In various embodiments, the framer may include the interleaver, the interleaver configured to perform rearranging the fraction of C bits per tile per row of each frame such that the fraction of high quality and low quality bits at the encoder output will be balanced among the tiles using an inner encoder. In some embodiments, the framer may include the encoder is a LDPC encoder. In various embodiments, the LDPC encoder is irregular. In some embodiments, the system may further include a decoder system that includes one or more inner decoders, a deinterleaver, and an outer decoder configured to decode tiles.

In many embodiments, an outer code received by the outer encoder may be a block code arranged into an L×C tile. In some embodiments, the block code is selected from the group consisting of BCH, Reed-Solomon, polar, Hamming and a product code with L rows and C columns. In various embodiments, the encoder system and the decoder system define a modular system configured to perform parallel encoding and decoding due to the modular structure with L rows and T tiles. In some embodiments, the decoder system may include L parallel row decoders and T parallel tile decoders. In many embodiments, an output of the inner decoder has an error floor, wherein multiple codes are shared in one or more tiles such that the error floor is reduced for each code.

In some embodiments, error bursts are dispersed from a given row to multiple tiles, when a decoding error occurs at the inner decoder for that row. In various embodiments, the outer decoder is bypassed for an entire frame when L rows have been correctly decoded by the inner decoder such that power and latency savings result. In many embodiments, the system may further include one or more data channels, the one or more data channels configured to send one or more soft decision instructions or parameters from the row decoders to tile decoders to allow soft decoding of one or more tiles. In some embodiments, one or more data channels are configured to send soft decision instructions or parameters from the row decoders. Outer decoders may be used with inner decoders in various embodiments.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, inputs, outputs, ports, channels, components and parts of the foregoing disclosed herein can be used with any LDPC-based system, code-based communication system, forward error correcting system, transmitter, transceiver, receiver, and other devices and systems without limitation.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A tiled concatenation system comprising:
an encoder system comprising one or more outer encoders implemented in one or more chips, wherein at least one outer encoder is configured to generate n bits from k bits;
a framer implemented on the one or more chips, the framer comprising an input, wherein the input receives T groups of n bits, wherein the framer is configured to rearrange the T groups of n bits to generate a set of T tiles, wherein each tile comprises L*C bits to generate a frame comprising L rows of K bits,
the framer configured to rearrange a fraction of C bits per tile per row of each frame such that a fraction of high quality and low quality bits at an encoder output will be balanced among the set of T tiles using an inner encoder; and
the inner encoder comprising the fraction of C bits.

2. The system of claim 1, wherein the framer is configured to group L innercode words together such that an amount of time needed to process a frame at the encoder system and a decoder is substantially deterministic while an amount of time to process a particular row may be highly variable.

3. The system of claim 1, wherein the framer comprises an interleaver, the interleaver configured to perform rearranging the fraction of C bits per tile per row of each frame such that the fraction of high quality and low quality bits at the encoder output will be balanced among the set of T tiles using an inner encoder.

4. The system of claim 1, wherein the at least one outer encoder is a LDPC encoder.

5. The system of claim 4, wherein the LDPC encoder is irregular.

6. The system of claim 1 further comprising a decoder system comprising one or more inner decoders, a deinterleaver, and an outer decoder configured to decode tiles.

7. The system of claim 1, wherein an outer code received by the at least one outer encoder may be a block code arranged into an L×C tile.

8. The system of claim 7, wherein the block code is selected from the group consisting of BCH, Reed-Solomon, polar, Hamming and a product code with L rows and C columns.

9. The system of claim 6 wherein the encoder system and the decoder system define a modular system configured to perform parallel encoding and decoding due to a modular structure with L rows and T tiles.

10. The system of claim 9, wherein the decoder system comprises L parallel row decoders and T parallel tile decoders.

11. The system of claim 6, wherein an output of the one or more inner decoder has an error floor, wherein multiple codes are shared in one or more tiles such that the error floor is reduced for each code.

12. The system of claim 6, wherein error bursts are dispersed from a given row to multiple tiles, when a decoding error occurs at the one or more inner decoder for that row.

13. The system of claim 6, wherein the outer decoder is bypassed for an entire frame when L rows have been correctly decoded by the one or more inner decoder such that power and latency savings result.

14. The system of claim 6, further comprising one or more data channels, the one or more data channels configured to send one or more soft decision instructions or parameters from row decoders to tile decoders to allow soft decoding of one or more tiles.

15. The system of claim 1, wherein L ranges from about 1 to about 1000, wherein C ranges from about 1 to about 1000, and wherein T ranges from about 1 to about 1000.

16. A method comprising:

generating n bits from k bits using an outer encoder in one or more chips;

configuring a framer in the one or more chips having an input to rearrange T groups of n bits to generate a set of T tiles, wherein each tile comprises L*C bits to generate a frame comprising L rows of K bits;

receiving T groups of n bits at the input of the framer; and rearranging a fraction of C bits per tile per row of each frame such that the fraction of high quality and low quality bits at an encoder output will be balanced among the set of T tiles using an inner encoder.

17. The method of claim 16, wherein the inner encoder comprises the fraction of C bits.

18. The method of claim 16 further comprising decoding the set of T tiles using an outer decoder.

19. The method of claim 16, wherein L ranges from about 1 to about 1000, wherein C ranges from about 1 to about 1000, and wherein T ranges from about 1 to about 1000.

20. The method of claim 16 further comprising rearranging the fraction of C bits per tile per row of each frame such that the fraction of high quality and low quality bits at the encoder output will be balanced among the set of T tiles using an inner encoder.

* * * * *